United States Patent
Tenea et al.

(10) Patent No.: US 9,923,656 B2
(45) Date of Patent: Mar. 20, 2018

(54) METHODS, SYSTEMS, AND COMPUTER READABLE MEDIA FOR TESTING RECOVERED CLOCK QUALITY

(71) Applicant: Ixia, Calabasas, CA (US)

(72) Inventors: Bogdan Tenea, Bucharest (RO); Alon Regev, Woodland Hills, CA (US)

(73) Assignee: KEYSIGHT TECHNOLOGIES SINGAPORE (HOLDINGS) PTE. LTD., Singapore (SG)

( * ) Notice: Subject to any disclaimer, the term of this patent is extended or adjusted under 35 U.S.C. 154(b) by 239 days.

(21) Appl. No.: 14/809,513

(22) Filed: Jul. 27, 2015

(65) Prior Publication Data

US 2016/0315756 A1    Oct. 27, 2016

(30) Foreign Application Priority Data

Apr. 21, 2015    (RO) ...................................... 15-00274

(51) Int. Cl.
| | |
|---|---|
| *H04L 12/26* | (2006.01) |
| *H04J 3/06* | (2006.01) |
| *H04J 3/14* | (2006.01) |
| *G01R 31/319* | (2006.01) |

(52) U.S. Cl.
CPC .............. *H04J 3/14* (2013.01); *H04J 3/0667* (2013.01); *H04L 43/0852* (2013.01); *H04L 43/50* (2013.01); *G01R 31/31922* (2013.01); *H04L 43/106* (2013.01)

(58) Field of Classification Search
CPC ................ H04L 43/50; H04L 43/0852; G01R 31/31922; H04J 3/0667
See application file for complete search history.

(56) References Cited

U.S. PATENT DOCUMENTS

| | | |
|---|---|---|
| 6,868,069 B2 | 3/2005 | Knobbe et al. |
| 7,092,586 B2 | 8/2006 | Vokey et al. |
| 7,881,209 B2 | 2/2011 | Beliles, Jr. et al. |

(Continued)

FOREIGN PATENT DOCUMENTS

| | | |
|---|---|---|
| WO | WO 2011/144263 A1 | 11/2011 |
| WO | WO 2016/168063 A1 | 10/2016 |

(Continued)

OTHER PUBLICATIONS

Watt et al., Understanding and Applying Precision Time Protocol, Power and Energy Automation Conference, Mar. 2014, 8 pages (including coverpage).*

(Continued)

*Primary Examiner* — Hoon J Chung (57) ABSTRACT

A system for testing recovered clock quality includes a test device for operating as a timing synchronization protocol master for communicating with a device under test functioning as a timing synchronization protocol slave or a timing synchronization protocol boundary clock to synchronize a clock of the device under test with a clock of the test device. The system further includes a recovered clock quality tester for receiving, from the device under test, a reverse synchronization message including clock information and for using the clock information to quantify a synchronization error between the clock of the device under test and the clock of the test device.

22 Claims, 7 Drawing Sheets

(56) References Cited

U.S. PATENT DOCUMENTS

| | | | |
|---|---|---|---|
| 8,718,482 | B1 | 5/2014 | Roberts |
| 8,767,565 | B2 | 7/2014 | Dalmau et al. |
| 9,130,945 | B2 | 9/2015 | Smith et al. |
| 9,380,070 | B1 | 6/2016 | Cain et al. |
| 9,686,169 | B2 | 6/2017 | Formby et al. |
| 9,699,051 | B2 | 7/2017 | Rata et al. |
| 9,736,804 | B2 | 8/2017 | Regev |
| 2003/0105976 | A1 | 6/2003 | Copeland, III |
| 2003/0200483 | A1* | 10/2003 | Sutton ............... G01R 31/2849 714/25 |
| 2004/0190547 | A1 | 9/2004 | Gordy et al. |
| 2007/0268938 | A1 | 11/2007 | Dowd |
| 2009/0217075 | A1 | 8/2009 | Adar et al. |
| 2009/0231191 | A1 | 9/2009 | Wu et al. |
| 2010/0039157 | A1 | 2/2010 | Kaeriyama et al. |
| 2010/0098111 | A1 | 4/2010 | Sun et al. |
| 2011/0170534 | A1 | 7/2011 | York |
| 2011/0199133 | A1 | 8/2011 | Yamada |
| 2011/0211473 | A1 | 9/2011 | Matityahu et al. |
| 2011/0268097 | A1 | 11/2011 | Agrawala et al. |
| 2012/0166327 | A1 | 6/2012 | Amicangioli |
| 2012/0275317 | A1 | 11/2012 | Geva |
| 2013/0080817 | A1 | 3/2013 | Mihelic |
| 2013/0094515 | A1 | 4/2013 | Gura et al. |
| 2013/0173778 | A1 | 7/2013 | Hsy et al. |
| 2013/0212439 | A1 | 8/2013 | Stevens et al. |
| 2013/0259049 | A1 | 10/2013 | Mizrahi |
| 2013/0265886 | A1 | 10/2013 | Leong |
| 2013/0278312 | A1 | 10/2013 | Getzin et al. |
| 2013/0329595 | A1 | 12/2013 | Scholz |
| 2013/0343207 | A1 | 12/2013 | Cook et al. |
| 2013/0347103 | A1 | 12/2013 | Veteikis et al. |
| 2014/0006610 | A1 | 1/2014 | Formby et al. |
| 2014/0164860 | A1 | 6/2014 | Kim |
| 2014/0185632 | A1 | 7/2014 | Steiner et al. |
| 2014/0297852 | A1 | 10/2014 | Shimizu et al. |
| 2014/0317288 | A1 | 10/2014 | Krueger et al. |
| 2014/0321285 | A1 | 10/2014 | Chew et al. |
| 2014/0344930 | A1 | 11/2014 | Foley |
| 2015/0016274 | A1 | 1/2015 | Holland |
| 2015/0023168 | A1 | 1/2015 | Kotecha et al. |
| 2015/0023170 | A1 | 1/2015 | Kakadia et al. |
| 2015/0281025 | A1 | 10/2015 | Wallbaum et al. |
| 2016/0065434 | A1 | 3/2016 | Janakiraman |
| 2016/0110211 | A1 | 4/2016 | Karnes |
| 2016/0285575 | A1 | 9/2016 | Holmeide |
| 2016/0301589 | A1 | 10/2016 | Rata et al. |
| 2016/0301599 | A1 | 10/2016 | Porfiri et al. |
| 2016/0306726 | A1 | 10/2016 | Regev |
| 2016/0309434 | A1 | 10/2016 | Regev |
| 2017/0041126 | A1 | 2/2017 | Bergeron |
| 2017/0085581 | A1 | 3/2017 | Jackson |

FOREIGN PATENT DOCUMENTS

| | | |
|---|---|---|
| WO | WO 2016/168064 A1 | 10/2016 |
| WO | WO 2017/052714 A1 | 3/2017 |

OTHER PUBLICATIONS

Texas Instrument, AN-1728 IEEE 1588 Precision Time Protocol Time Synchronization Performance, Application Report, SNLA098A—Oct. 2007—Revised Apr. 2013, 10 pages.*

Arnold, "What Are All of These IEEE 1588 Clock Types," http://blog.meinbergglobal.com/2013/10/21/ieee1588clocktypes/, News and Tutorials from Meinberg, pp. 1-6 (Oct. 21, 2013).

"AN-1838 IEEE 1588 Boundary Clock and Transparent Clock Implementation Using the DP83640," Application Report, Texas Instruments, pp. 1-9 (Apr. 2013).

Non-Final Office Action for U.S. Appl. No. 14/860,630 (dated Dec. 19, 2016).

Commonly-assigned, co-pending International Applied No. PCT/US16/40532 for "Methods, Systems, and Computer Readable Media for Detecting Physical Link Intrusions," (Unpublished, filed Jun. 30, 2016).

Non-Final Office Action for U.S. Appl. No. 14/819,337 (dated Mar. 2, 2017).

Notice of Allowance and Fee(s) Due for U.S. Appl. No. 14/685,552 (dated Mar. 1, 2017).

Notice of Allowance and Fee(s) Due for U.S. Appl. No. 13/933,661 (dated Feb. 17, 2017).

Non-Final Office Action for U.S. Appl. No. 14/685,552 (dated Oct. 20, 2016).

Non-Final Office Action for U.S. Appl. No. 14/688,630 (dated Oct. 17, 2016).

Non-Final Office Action for U.S. Appl. No. 13/933,661 (dated Sep. 27, 2016).

Notification of Transmittal of the International Search Report and the Written Opinion of the International Searching Authority, or the Declaration for International Application No. PCT/US2016/040532 (dated Sep. 12, 2016).

Notification of Transmittal of the International Search Report and the Written Opinion of the International Searching Authority, or the Declaration for International Application No. PCT/US2016/026534 (dated Jul. 8, 2016).

Notification of Transmittal of the International Searh report and the Written Opinion of the International Searching Authority, or the Declaration for International Application No. PCT/US2016/026533 (dated Jul. 8, 2016).

Final Office Action for U.S. Appl. No. 13/933,661 (dated Apr. 12, 2016).

Non-Final Office Action for U.S. Appl. No. 13/933,661 (dated Dec. 14, 2015).

Commonly-assigned, co-pending U.S. Appl. No. 14/860,630 for "Methods, Systems, and Computer Readable Media for Detecting Physical Link Intrusions," (Unpublished, filed Sep. 21, 2015).

Commonly-assigned, co-pending U.S. Appl. No. 14/819,337 for "Modeling a Clock," (Unpublished, filed Aug. 5, 2015).

"Network Time Protocol," Wikipedia, https://en.wikipedia.org/wiki/Network_Time_Protocol, pp. 1-7 (Jul. 3, 2015).

Commonly-assigned, co-pending U.S. Appl. No. 14/688,630 for "Methods, Systems, and Computer Readable Media for Synchronizing Timing Among Network Interface Cards (NICs) in a Network Equipment Test Device," (Unpublished, filed Apr. 16, 2015.

Commonly-assigned, co-pending U.S. Appl. No. 14/688,644 for "Methods, Systems, and Computer Readable Media for Emulating Network Devices with Different Clocks," (Unpublished, filed Apr. 16, 2015).

Commonly-assigned, co-pending U.S. Appl. No. 14/685,552 for "Methods, Systems, and Computer Readable Media for One-Way Link Delay Measurement," (Unpublished, filed Apr. 13, 2015).

"High Density Modular Fiber Tap," Ixia, http://www.ixiacom.com/products/net-optics-flex-tap, pp. 1-4 (Jul. 2014).

"Ixia Anue 3500—Mobile Backhaul Testing Solution," Ixia Data Sheet, pp. 1-5 (Dec. 2013).

Spirent, "Precision Time Protocol (PTP) IEEE 1588," YouTube "alantalkstech", https://www.youtube.com/watch?v=yw-gd01aOYg, pp. 1-11 (Dec. 7, 2011).

Eidson, "IEEE-1588 Standard for a Precision Clock Synchronization Protocol for Networked Measurement and Control Systems—A Tutorial," Agilent Technologies, pp. 1-94 (Oct. 2005).

Non-Final Office Action for U.S. Appl. No. 14/688,644 (dated Jul. 26, 2017).

Notice of Allowance and Fee(s) Due for U.S. Appl. No. 14/819,337 (dated Jun. 21, 2017).

Notice of Allowance and Fee(s) Due and Examiner Initiated Interview Summary for U.S. Appl. No. 14/860,630 (dated Jun. 13, 2017).

Notice of Allowance and Fee(s) Due for U.S. Appl. No. 14/688,630 (dated Apr. 12, 2017).

Commonly-assigned, co-pending U.S. Appl. No. 15/482,672 for "Methods, Systems, and Computer Readable Media for Monitoring, Adjusting, and Utilizing Latency Associated With Accessing Distributed Computing Resources," (Unpublished, filed Apr. 7, 2017).

(56) References Cited

OTHER PUBLICATIONS

"External Bypass Switches," Ixia, White Paper, 915-6688-01 Rev. B, pp. 1-5 (Dec. 2015).

* cited by examiner

METHODS, SYSTEMS, AND COMPUTER READABLE MEDIA FOR TESTING RECOVERED CLOCK QUALITY

PRIORITY CLAIM

This application claims the benefit of Romanian Patent Application No., a 2015 00274 filed Apr. 21, 2015; the disclosure of which is incorporated herein by reference in its entirety.

TECHNICAL FIELD

This specification relates generally to clock synchronization, e.g., to testing the quality of clock synchronization between two or multiple independent systems.

BACKGROUND

Devices in a network that are required to have synchronized clocks can use timing synchronization protocols to synchronize with each other. One example of such a protocol is the Precision Time Protocol (PTP). PTP uses a master-slave architecture for clock distribution. A PTP master is a device with one or more clocks with which other devices, referred to as PTP slaves, synchronize. A PTP master causes a PTP slave to synchronize the slave's local clock to the clock of the master by periodically sending a synchronization message to the slaves over the data communications network.

To test the quality of the slave systems in synchronizing the local clocks of the slave (device under test) with the clock of the master (the test device), some slave systems provide a separate physical interface to output a test signal, e.g., a one pulse per second (PPS) output or a 10 MHz output. However, requiring a separate interface for testing recovered clock quality is undesirable in some applications, such as automobile electronic control units, where production costs or the operating environment makes a separate physical test interface infeasible.

Another problem associated with testing recovered clock quality is that the network messages used to test recovered quality may be layer two messages that are not mutable over a layer two network. As a result, testing can only be performed on a point-to-point basis and results from every point need to be stored. When a network includes one or more boundary clocks between a master and a slave, a single test system that is only connected to one of the boundary clocks may not be capable of testing the recovered clock quality of the remaining boundary clocks and the slave.

Accordingly, there exists a need for improved methods, systems, and computer readable media for testing recovered clock quality.

SUMMARY

The quality of a recovered clock on a slave device (device under test) can be tested using the same or a different physical network interface that the slave (device under test) uses for receiving synchronization messages from a master (test device). In one example, A system for testing recovered clock quality includes a test device for operating as a timing synchronization protocol master for communicating with a device under test functioning as a timing synchronization protocol slave or a timing synchronization protocol boundary clock to synchronize a clock of the device under test with a clock of the test device. The system further includes a recovered clock quality tester for receiving, from the device under test, a reverse synchronization message including clock information and for using the clock information to quantify a synchronization error between the clock of the device under test and the clock of the test device. device. The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

DETAILED DESCRIPTION

Figure 1:
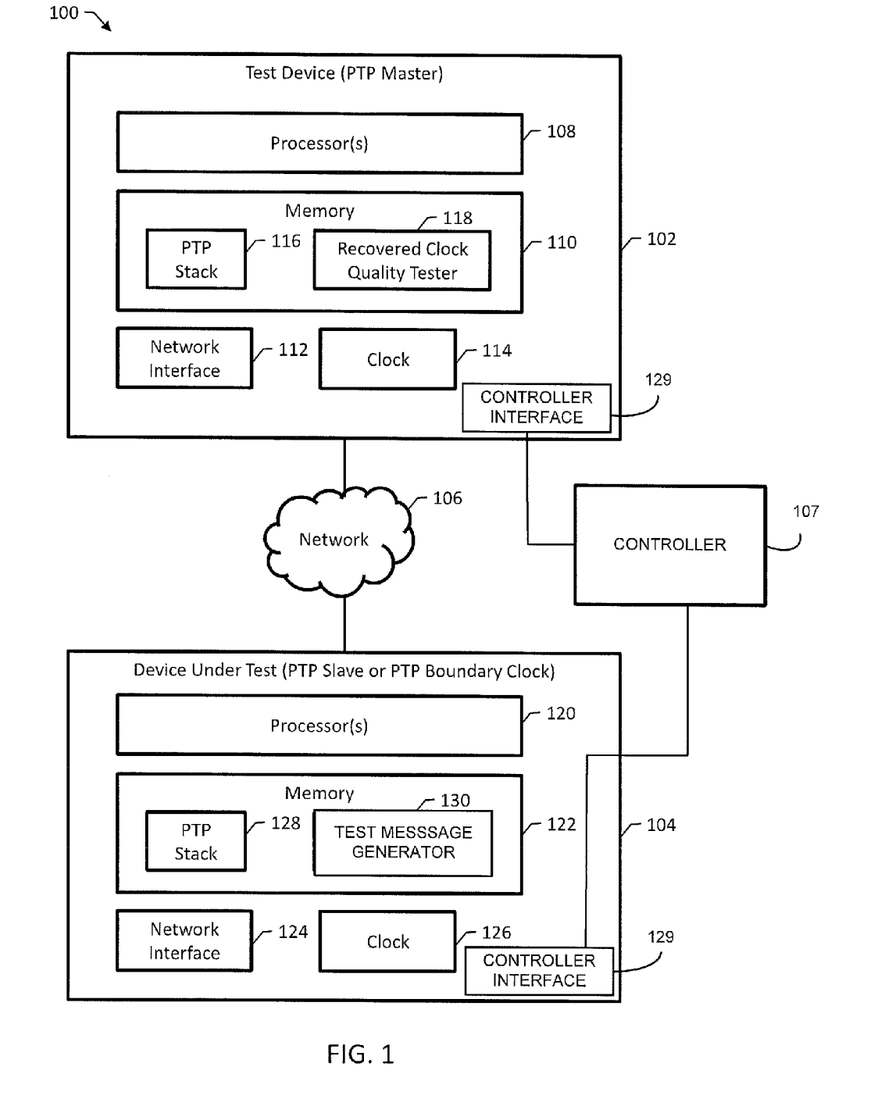
FIG. 1 is a block diagram of an example master and slave communication system.

FIG. 1 is a block diagram of an example master and slave communication system 100. System 100 includes a test device 102 operating as a clock master, such as a PTP master, and a device under test 104 operating as a clock slave, such as a PTP slave, communicating over a data communications network 106. As stated above, in one embodiment, the data communications network 106 may be a layer two network such that messages used to test the recovered clock quality are sent point-to-point over the layer two network. Accordingly, the system may further include a controller 107 that interfaces with one or more devices under test 104 to enable each device under test 104 to generate "reverse sync" messages for test purposes. Exemplary operations performed by controller 107 and device under test 104 when generating "reverse sync" messages will be described in further detail below.

Test device 102 includes one or more processors 108, memory 110, a network interface 112, and a local clock 114 of test device 102. Processor 108 is connected to memory 110. The Instructions for processor 108 are stored on memory 110. These instructions include a PTP stack 116 for sending and receiving messages in compliance with a PTP protocol, e.g., as specified by the IEEE 1588-2002 standard, the IEEE 1588-2008 standard, or any appropriate PTP standard. The instructions also include a recovered clock quality tester 118 for testing the quality of clocks derived by slave devices, such as PTP slave devices, from clock 114 of test device 102, e.g., as described further below with reference to FIGS. 2 and 3.

Network interface 112 is configured to send and receive PTP messages over the network 106. For example, network interface 112 can be a physical port for wired or wireless communications, e.g., an Ethernet port. Clock 114 is a local clock of test device 102 that generates current time of day information for the test device 102. For example, clock 114 can be based on a quartz oscillator or any appropriate circuit for generating a timing signal. In another example, the clock provided by clock 114 can be derived from the clock of another master or other time source.

Device under test 104 includes one or more processors 120, memory 122, a network interface 124, and a clock 126. Memory 122 stores a PTP stack 128 and a test message generator 130. In some examples, test message generator 130 is integrated into PTP stack 128. A system test engineer can install custom test software onto device under test 104 to test device under test 104, e.g., to test the quality of the clock derived by device under test 104 from PTP exchanges with test device 102. Device under test 104 may also include a controller interface 129 that enables device under test to communicate with controller 107. Controller interface 129 may be a layer three or higher interface such that device under test 104 is not required to be connected to controller 107 over a layer two network. For example, controller interface 129 may communicate with controller 107 over a Wi-Fi or other type of layer three or higher network. Test device 102 may also include a controller interface 129 that allows controller 107 to control test device 102 to initiate a test and communicate results to controller 107.

In some examples, network interface 124 of device under test 104 may be the only network interface 124 of device under test 104 or the only available network interface 124 of device under test 104. Test device 102 can be configured to communicate with device under test 104 using network interface 124 and to also test the quality of device under test 104 in synchronizing clock 126 of device under test 102 with clock 114 of test device 102 using the same network interface 124.

In operation, test device 102 sends device under test 104 a synchronization message, such as a PTP synchronization message, causing device under test 104 to synchronize clock 126 of the device under test 104 with clock 114 of test device 102, i.e., by calculating an offset between clock 126 of device under test 104 and clock 114 of test device 102 and using the offset to generated adjusted clock values. When in test mode, device under test 104 echoes its local time to test device 102 by periodically sending synchronization messages (the reverse synchronization messages) to the test device 102. Test device 102 determines, using the reversed synchronization message (referred to herein as a reverse synchronization message), a synchronization error for clock 126 of device under test 104 based on the actual time on test device 102, the sent timestamp (reported by device 104), the received timestamp (measured by device 102), and the path delay between test device 102 and device under test 104 over network 106.

Figure 2:
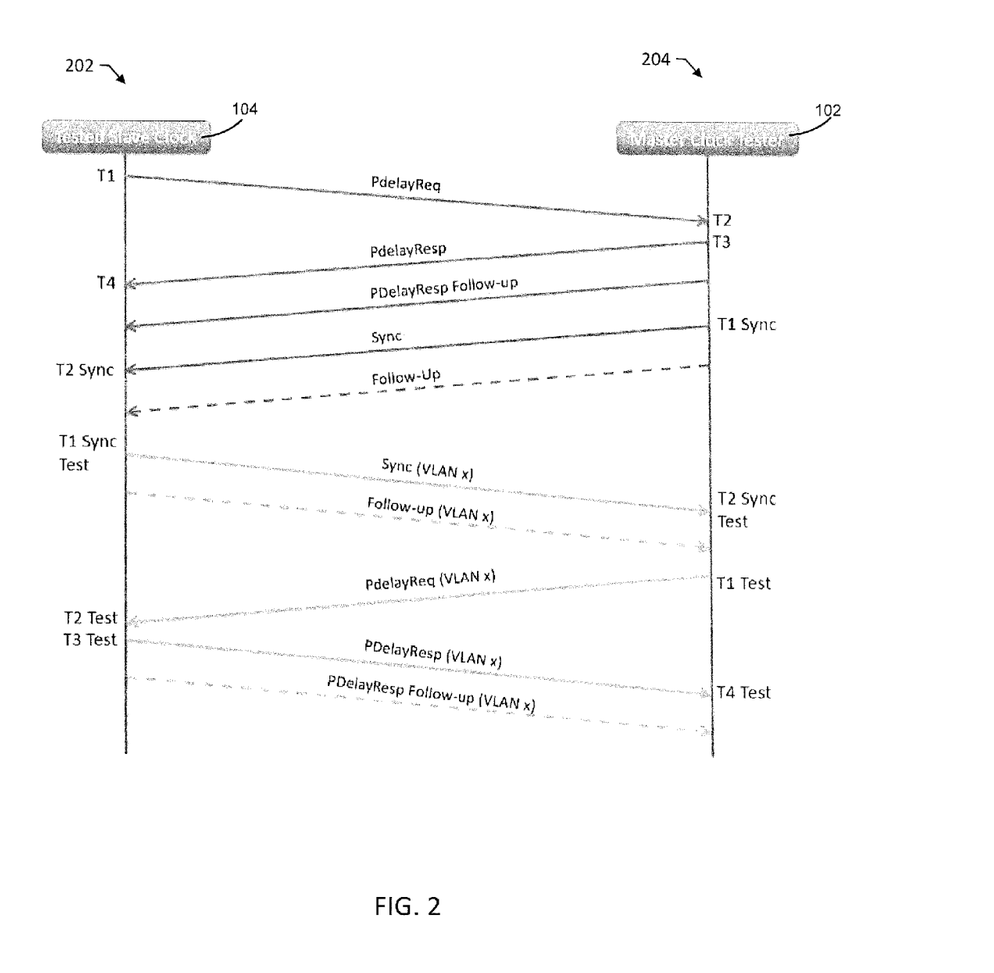
FIG. 2 is a timing diagram illustrating an example exchange of messages between a master system and a slave system.

FIG. 2 is a timing diagram illustrating an example exchange of messages between test device 102 and device under test 104. A column 202 on the left shows timestamps for times relative to clock 126 of device under test 104 as recorded by device under test 104, and a column 204 on the right shows timestamps for times relative to clock 114 of test device 102 as recorded by test device 102.

In a first sequence, slave system 104 initiates a PTP path delay message exchange to determine a path delay between slave system 104 and master system 102 over network 106. At time T1 as recorded by device under test 104, device under test 104 sends a delay request message to test device 102, and test device 102 records time T2 as the received time for the delay request message.

At time T3 as recorded by test device 102, test device 102 sends a delay response message to device under test 104. The delay response message includes the value of timestamp T2. At time T4 as recorded by device under test 104, device under test 104 receives the delay response message. In some cases, test device 102 is not configured to record the T3 timestamp at the same time as sending the delay response message, so test device 102 sends a delay response follow-up message with the T3 timestamp. Assuming that the path delay is symmetric, device under test 104 can determine the path delay using the following equation:

$$\text{Path Delay} = \frac{((T2-T1)+(T4-T3))}{2}$$

In a second sequence, test device 102 sends a synchronization message to device under test 104 at time T1 Sync as recorded by test device 102. Test device 102 can send the T1 Sync timestamp to device under test 104 with the synchronization message or, in some examples, in a follow-up message. Device under test 104 receives the synchronization message at time T2 Sync as recorded by device under test 104.

Since device under test 104 determined the path delay in the first sequence, device under test 104 can determine a clock offset in time between clock 126 of device under test 104 and clock 114 of test device 102 using the following equation:

Offset=(T2Sync−T1Sync)−Path Delay

Device under test 104 can adjust clock 126 of device under test 104 using the clock offset to match clock 114 of test device 102. In some examples, test device 102 periodically sends synchronization messages to device under test 104, causing device under test 104 to synchronize clock 126 of device under test 104 on a regular basis.

In a third sequence, device under test 104 sends a reverse synchronization message to test device 102 at time T1 Sync Test as recorded by device under test 104 using the synchronized clock 126 of device under test 104. Device under test 104 can send the T1 Sync Test timestamp to test device 102 with the reverse synchronization message or, in some examples, in a follow-up message. Test device 102 receives the reverse synchronization message at time T2 Sync Test as recorded by test device 102. Test device 102 can determine the synchronization error using the following equation:

Sync error=(T2Sync Test−T1Sync Test)−Path Delay

In some examples, device under test 104 sends the reverse synchronization message before synchronizing clock 126 of device under test 104, so that the T1 Sync Test timestamp uses clock 126 of device under test 104 before synchronization. For example, by sending the reverse synchronization message before synchronizing the slave clock 126, test device 102 can determine the extent of synchronization error between periodic synchronization messages.

Device under test 104 can send synchronization messages to Test device 102, e.g., periodically, or in response to synchronization messages from test device 102, which test device 102 can send periodically. Test device 102 can use the determined synchronization error to determine, e.g., whether a device under test 104 is within acceptable running parameters. For example, test device 102 can cause a display to display an error message to a system test engineer if the synchronization error is greater than a configured threshold.

Test device 102 can also forward the data from the received sync packet (including the timestamp of transmission using clock from device under test 104) as well as the sync message receipt time as well as calculated path delay to a controller 107 and the controller can determine the synchronization error (instead of having test device 102 do this).

In addition to determining the clock offset, test device 102 or controller 107 can also perform further mathematical analysis to compute min./max./avg. offset between the master an slave clocks, slave clock jitter, separate offset vs. frequency correction errors, as well as validating the offset and frequency correction calculations performed in device under test 104.

Test device 102 can receive the path delay from device under test 104 or, in some examples, determine the path delay independently using a fourth sequence. In the fourth sequence, the master system initiates a PTP exchange to determine a path delay between the slave system 102 and master system 104 over network 106. At time T1 Test as recorded by test device 102, test device 102 sends a delay request message to device under test 104, and device under test 104 records time T2 Test as the received time for the delay request message.

At time T3 Test as recorded by device under test 104, device under test 104 sends a delay response message which is recorded as received by test device 102 at time T4 Test. In some examples, device under test 104 sends a follow-up message with the T3 Test timestamp. Test device 102 can determine the path delay as described above with reference to the first sequence.

In some examples, test device 102 and device under test 104 can complete the third and fourth sequences using a virtual link. For example, test device 102 and device under test 104 can establish a virtual local area network (VLAN) for testing purposes for a testing period. Using a virtual link can be useful, e.g., so that the testing messages do not interfere with regular PTP operation.

Figure 3:
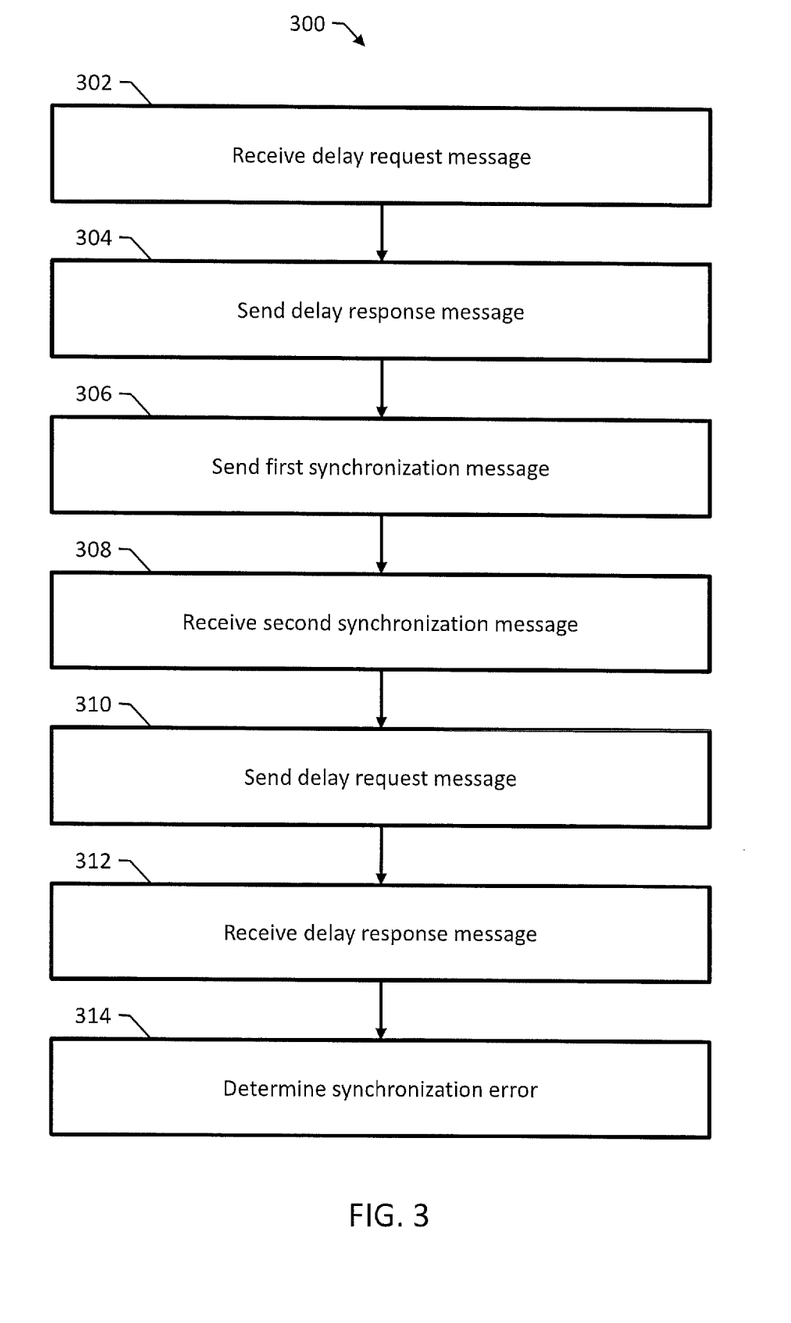
FIG. 3 is a flow diagram of an example method performed by a master system.

FIG. 3 is a flow diagram of an example method 300 performed by a test system, e.g., test device 102 of FIG. 1. A non-transitory computer readable medium can store instructions that, when executed by one or more computing devices of the master system, cause the master system to perform method 300.

Test device 102 receives a delay request message (302) from a slave system over a data communications network and, in response, sends a delay response message (304), enabling device under test 104 to determine the path delay between test device 102 and device under test 104.

Test device 102 sends a first synchronization message (306) to a network interface of device under test 104, causing the device under test 104 to synchronize a clock of device under test 104 with a clock of test device 102. For example, test device 102 can periodically send synchronization messages to a number of devices under test 102 operating as PTP slaves or boundary clocks to keep local clocks of the devices under test synchronized with a clock of test device 102. In some examples, Test device 102 can send a follow-up message with a timestamp for the time that the test system 102 sends the first synchronization message.

Test device 102 receives a second synchronization message (308) (i.e., a reverse synchronization message) from the network interface of device under test 104. Test device 102 receives a sent timestamp for the second synchronization message and generates a received timestamp for the second synchronization message.

Test device 102 determines the path delay between test device 102 and device under test 104 over the data communications network, e.g., by receiving the path delay from the slave system or by sending a delay request message (310) and receiving a delay response message (312). Test device 102 determines a synchronization error (314) for the clock of device under test 104 based on the sent timestamp, the received timestamp, and the path delay. For example, the master system can subtract the path delay and the received timestamp from the sent timestamp.

Figure 4:
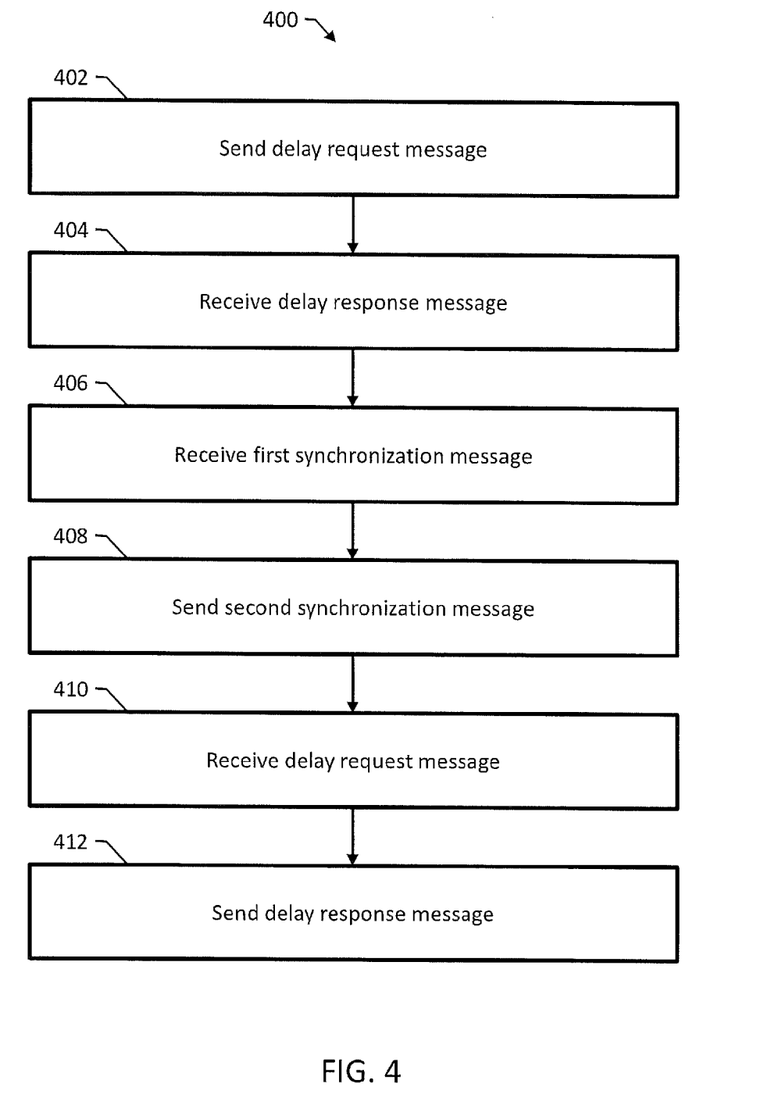
FIG. 4 is a flow diagram of an example method performed by a slave system.

FIG. 4 is a flow diagram of an example method performed by a device under test, e.g., device under test 104 of FIG. 1. A non-transitory computer readable medium can store instructions that, when executed by one or more computing devices of the device under test, cause the slave system to perform the method 400.

Device under test 104 determines the path delay between device under test 104 and test device 102 over a data communications network by sending a delay request message (402) using a network interface of device under test 104 to test device 102 and receiving a delay response message (404). Device under test 104 receives a first synchronization message (406) from test device 102 at the network interface, and in response synchronizes the clock of device under test 104 using the first synchronization message.

Before or after synchronizing the clock of device under test 104, sends a second or reverse synchronization message (408) to the clock of test device 102 using the same network interface, enabling test device 102 to determine a synchronization error for the clock of device under test 104. The slave system can send the path delay to test device 102, or test device 102 can receive a delay request message (410) and send a delay response message (412) to test device 102, enabling the test device 102 to determine the path delay.

Figure 5:
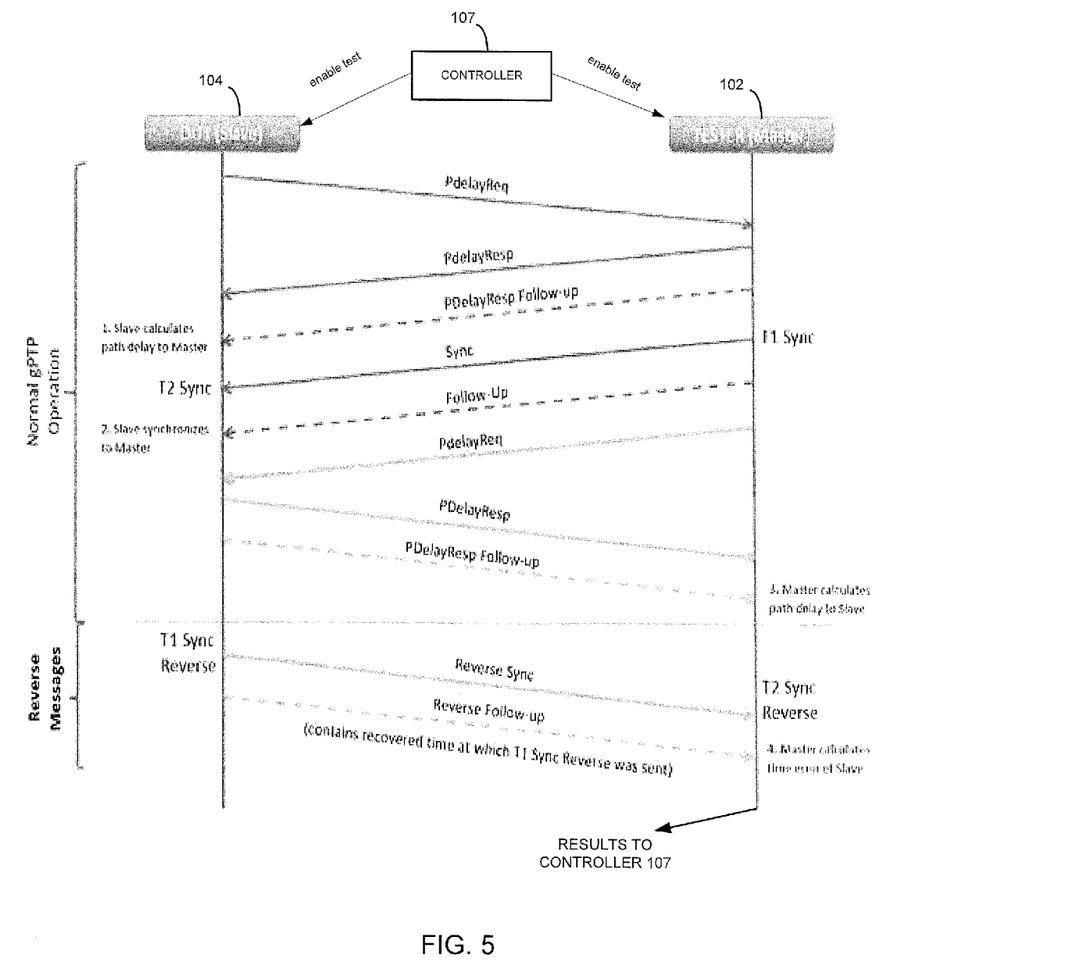
FIG. 5 is a message flow diagram illustrating exemplary testing of clock recovery error using a controller.

As stated above, in some networks, a dedicated tester platform may not be directly connected to the device under test, and a separate controller may be required to initiate the testing and to enable the device under test to become a PTP master. FIG. 5 illustrates the general steps for a test device in testing a directly connected device, which may be repeated to test recovered clock quality on nodes that are not directly connected to the test device. FIG. 5 is a message flow diagram illustrating exemplary steps performed between a test device 102, device under test 104, and controller 107. Referring to FIG. 5, controller 107 sends an enable test message to master 102 and to slave 104, which enables master 102 and slave 104 to initiate clock recovery error testing. The messages within the bracket labelled "Normal gPTP Operation" are the same as those illustrated in FIG. 2 except that the path delay request and path delay response sent by test device 102 to device under test 104 are sent before the reverse sync and reverse follow up messages. Once the reverse sync and reverse follow up messages are sent by slave 104 to master 102, master 102 calculates the clock recovery error of slave 104. After calculating the error, test device 102 communicates the calculated error to controller 107. The following are exemplary steps that may be performed by the system illustrated in FIG. 5 to test one or more devices under test.

Figure 6A:
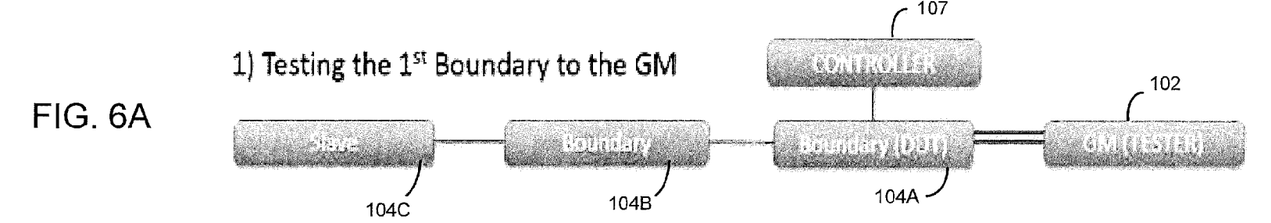
FIGS. 6-6C are block diagrams illustrating testing of individual links in a network including one or more boundary clocks.
Figure 6B:
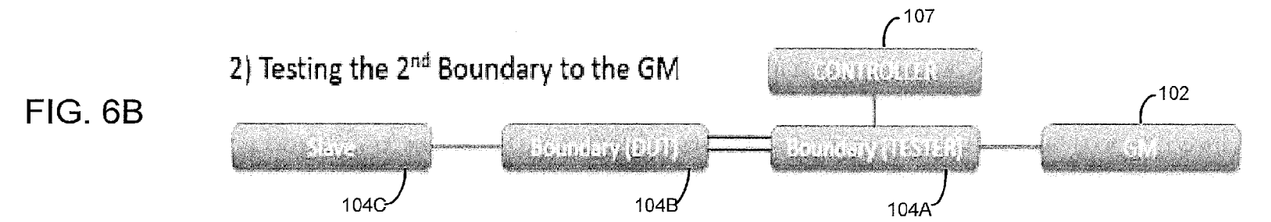
Figure 6C:
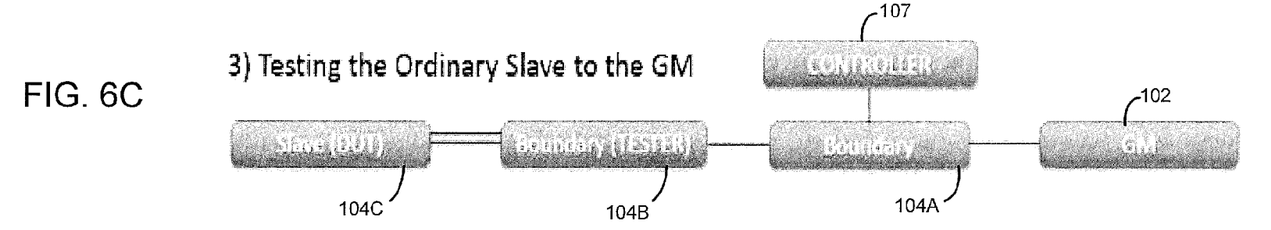

When a network includes one or more boundary clocks, each clock may be tested using the mechanism illustrated in FIG. 5. FIGS. 6A through 6C illustrate such a concept. In FIG. 6A through 6C, test device 102 is connected to a single device under test 104A, which functions as a PTP boundary clock. A PTP boundary clock is a device with one port that functions as a slave and receives time from a master and all other ports act as masters, which disseminate time to downstream slaves. Controller 107 is initially connected to the device under test 104A, which is directly connected to test device 102. However, once test device 102 determines the clock error for the first device under test 104A, controller 107 enables device under test 104A to become the test device, as illustrated in FIG. 6B where device under test 104A functions as a test device for a second device under test 104B, which also functions as a PTP boundary clock. The process is repeated where controller 107 device under test 104B to become the test device to test device under test 104C, which functions as a PTP slave, as illustrated in FIG. 6C. Each device under test may report its clock error to controller 107. Controller 107 may compute the clock errors for each link and the worst possible end-to-end clock error between test device 102 and device under test 104C, i.e., by adding the absolute values of the clock errors of each link in the network.

The following steps may be performed by controller 107 to test the timing on the links illustrated in FIGS. 6A-6C.
1) Controller 107 enables the measurement of the recovered clock error on the node operating as the test device, which is always the device that in the respective converged PTP topology is the master of the DUT. The enable message may specify the tester clock ID and the port on which the measurements are to be made.
2) Controller 107 enables the generation of reverse sync and follow-up messages from the DUT, on the port connected to the test device in the respective converged PTP topology. The enable message may specify the DUT Clock ID and the port on which the reverse messages are to be sent.
3) Upon receipt of reverse sync and follow-up messages the test device may calculate and store the time error, calculated for each individual message, as described above with respect to FIGS. 2 and 5. The data may be a list of measured time errors, called offsets, that may be either positive or negative, depending if the slave clock was ahead or behind the master. The list will also have a unique tuple specified by <TESTERClockId, TESTERPort, DUTClockId, DUTPort> which enable to uniquely identify the link on which the measurements were taken.
4) At a convenient time, the list of measurements is sent from the test device to controller 107 through a unicast directed message. The message may also specify the unique tuple for which the measurements were taken. After sending the data the collected data can be released from test device memory.
5) Controller 107 may collect the data periodically received from the test device, and calculate statistics on the data, containing at least the minimum, maximum and average offset values since the measurement behavior was activated.
6) When enough samples have been collected, controller 107 may send a message to both the DUT and the test device to stop the measurement procedure.

Procedure for Measuring a PTP Network Containing Boundary Clocks

When an end to end time error measurement is needed, the procedure described above will be applied to each PTP device on the path from the grandmaster (GM) to the slave, starting from the PTP boundary clock directly connected the grandmaster. For a fairly simple topology, as depicted in FIGS. 6A-6C, where two lines designate a link where measurements are being taken, the following steps may be performed:
1) The error of the recovered clock of the boundary directly connected to the grandmaster is first measured and analyzed. In this case the reverse path measurement is taken on the link directly connected to the GM. The measurements will depict its error relative to the grandmaster time.
2) The error of the recovered clock of the boundary clock connected to the boundary clock that is directly connected to the GM is then measured and analyzed. In this case the reverse path measurement is taken on the link between the boundary clocks. The measurements will include any error that the previous measurement detected.
3) The error of the recovered clock of the slave connected to the boundary clock is lastly measured and analyzed. The measurements will depict its error relative to the grandmaster time, and will include any error introduced by the two bridges above.

General Considerations when Applying PGP Test Method to a Deployed PTP Network

1) Measurements made at any one test device in the PTP chain will include in the reported measurements any accumulated error introduced by the test device itself and by the boundary clocks along the path to the test device, which may function as a PTP grandmaster. To measure just the recovered clock quality of a specific device that device needs to be directly connected to a test device containing the dock with which the clock of the device under test is being synchronized.
2) The method described above allows, by testing link by link down the path from a test device functioning as a PTP master or a PTP grandmaster to the end node functioning as a PTP slave, measurement of the error introduced by each device, by subtracting the error measured at the device preceding the device in the PTP chain.

Figure 7:
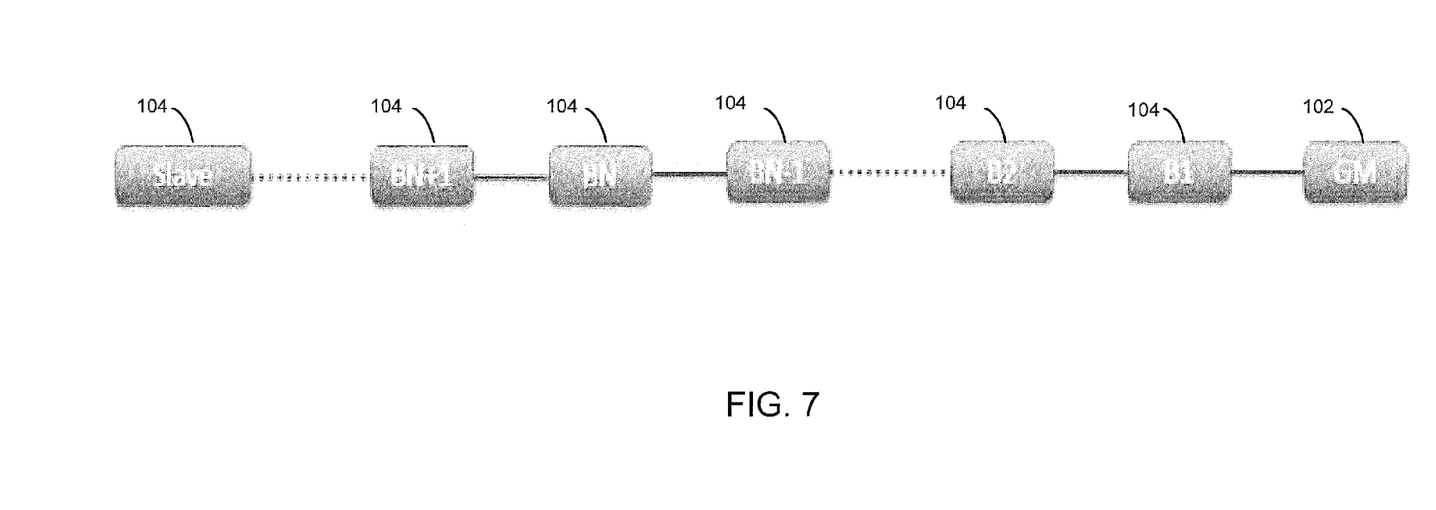
FIG. 7 is a block diagram illustrating testing of individual links in a network including one or more boundary clocks.

FIG. 7 illustrates the general case where a test device 102 operating as a grandmaster is connected to a device under test 104 through a chain of N+1 devices under test 104 operating as PTP boundary clocks. To measure the error Introduced by clock N+1 in the chain, one may do the measurement on dock N and dock N−1. The error is given by the formulas:

Max Offset of $B_{N+1}$=Max Offset measured on $B_N$−Max Offset measured on $B_{N-1}$ Min Offset of $B_{N+1}$=Min Offset measured on $B_N$−Min Offset measured on $B_{N-1}$ Max Error of $B_{N+1}$=Max(Max Offset of $B_{N+1}$,Abs (Min Offset of $B_{N+1}$))

In the formulas, $B_N$ represents the $N^{th}$ device under test in the chain, and the offsets are measured with respect to the grandmaster dock. These formulas are true after a high number of samples, so that they have statistic relevance. The most accurate measurements are made though by connecting the respective boundary clock directly to the bridge. Controller 107 can reside anywhere in the network, either as a separate device, or even on one the PTP clocks active in the network. It may be convenient to have controller 107 on the grandmaster device. Thus, controller 107 can be a component of test device 102 or on a node separate from test device 102.

Multiple measurements can be made at the same time on multiple DUTs. This allows for active monitoring of the timing quality in a network, which may also go on normal PTP network operation, and not just in a debugging session. For example, controller 107 may instruct a device to function concurrently as a slave and as master so that clock recovery error both upstream and downstream from the device can be simultaneously quantified.

As described above, rather than using synchronization messages only for clock synchronization, the subject matter described herein uses such messages in reverse, i.e., the reverse synchronization messages, to test recovered clock quality.

Although in the examples described above, the test device that receives the reverse synchronization message is the timing synchronization protocol master, the subject matter described herein is not limited to such an implementation. In an alternate implementation, the device that receives the reverse sync message may be a computing platform that is separate from the master device. For example, a slave device may synchronize its clock with the clock of a master using the protocols described herein or alternate protocols. The slave can then send the reverse synchronization message to a tester separate from the master, and the tester can validate recovered clock quality. To perform such validation, the tester's clock may be synchronized with that of the master.

According to another aspect of the subject matter described herein the rate of transmission of reverse synchronization messages may be configurable. For example, controller 107 may include a user interface that allows the test engineer to configure the rate of sending reverse synchronization messages to the device under test to be the same as or different from the rate at which synchronization messages are sent from the master to the device under test. Such a configuration option enables the recovered clock quality to be tested at any time desired by the test engineer. According to another aspect of the subject matter described herein, recovered clock quality tester 118 is configured to use delay request and response messages to measure network delay between peer nodes. For example, recovered clock quality tester 118 may use the delay request/response procedure described herein to message network delay between any two connected peer devices.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A system for testing recovered clock quality, the system comprising:
    a test device for operating as a timing synchronization protocol master for communicating with a device under test functioning as a timing synchronization protocol slave or a timing synchronization protocol boundary clock to synchronize a clock of the device under test with a clock of the test device; and
    a recovered clock quality tester for receiving, from the device under test, a reverse synchronization message including clock information and for using the clock information to quantify a synchronization error between the clock of the device under test and the clock of the test device, wherein the test device is configured to perform operations comprising:
        sending a synchronization message to the device under test, causing the device under test to synchronize the clock of the device under test with the clock of the test device;
        receiving, from the device under test, the reverse synchronization message and a sent timestamp for the reverse synchronization message, generating a received timestamp for the reverse synchronization message using the clock of the test device; and
        determining the synchronization error for the clock of the device under test based on the sent timestamp, the received timestamp, and a path delay between the test device and the device under test over a data communications network.

2. The system of claim 1, wherein determining the synchronization error comprises subtracting the path delay and the received timestamp from the sent timestamp.

3. The system of claim 1, wherein the sent timestamp is generated by the device under test using the clock of the device under test before synchronizing the clock of the device under test with the clock of the test device.

4. The system of claim 1, wherein receiving the reverse synchronization message comprises receiving the reverse synchronization message over a virtual link.

5. The system of claim 4, wherein the virtual link is a virtual local area network (VLAN) established for a testing period.

6. The system of claim 1, wherein the operations further include receiving an indication of the path delay from the device under test.

7. The system of claim 6, wherein receiving the indication of the path delay includes receiving a delay request message from the device under test and, in response, sending a delay response message to the device under test, enabling the device under test to determine the path delay.

8. The system of claim 1, wherein the operations further include determining the path delay by sending a delay request message to the device under test and receiving a delay response message from the device under test.

9. The system of claim 8, wherein determining the path delay comprises calculating the path delay using the following formula:

$$\text{Path Delay} = \frac{((T2 - T1) + (T4 - T3))}{2}$$

wherein:
    T1 is a timestamp generated by the test device using the clock of the test device for sending the delay request message;
    T2 is a timestamp generated by the device under test using the clock of the device under test for receiving the delay request message;
    T3 is a timestamp generated by the device under test using the clock of the device under test for sending the delay response message; and
    T4 is a timestamp generated by the test device using the clock of the test device for receiving the delay response message.

10. The system of claim 1 comprising a controller for enabling the test device and the device under test to perform testing to determine the synchronization error.

11. The system of claim 10 wherein the recovered clock quality tester reports the synchronization error to the controller.

12. The system of claim 11 wherein the controller is configured to control the device under test to function as a recovered clock quality tester to determine clock synchronization error between the clock of the device under test and a clock of an additional device under test.

13. The system of claim 12 wherein the additional device under test functions as a timing synchronization protocol boundary clock or slave.

14. The system of claim 10 wherein the controller includes a configuration interface for configuring a rate for sending reverse synchronization messages from the device under test.

15. The system of claim 1 wherein the timing synchronization protocol comprises a precision time protocol (PTP).

16. The system of claim 1 wherein the test device communicates synchronization messages to the device under test over a physical interface of the device under test used to send the reverse synchronization message.

17. The system of claim 1 wherein the test device communicates synchronization messages to the device under test over a physical interface of the device under test different from a physical interface used to send the reverse synchronization message.

18. The system of claim 1 wherein the recovered clock quality tester is a component of the test device.

19. The system of claim 1 wherein the recovered clock quality tester is a component of a computing platform separate from the test device.

20. The system of claim 1 wherein the recovered clock quality tester is configured to use delay request and response messages to measure network delay between peer nodes.

21. A method for testing recovered clock quality, the method comprising:
operating as a timing synchronization protocol master for communicating with a device under test over a first physical interface of the device under test to synchronize a clock of the device under test operating as a timing synchronization protocol slave or a timing synchronization protocol boundary clock with a clock of the test device;
sending a synchronization message to the device under test, causing the device under test to synchronize the clock of the device under test with the clock of the test device;
receiving, from the device under test, a reverse synchronization message including clock information and a sent timestamp for the reverse synchronization message, generating a received timestamp for the reverse synchronization message using the clock of the test device; and
using the clock information to quantify a synchronization error between the clock of the device under test and the clock of the test device, including determining the synchronization error for the clock of the device under test based on the sent timestamp, the received timestamp, and a path delay between the test device and the device under test over a data communications network.

22. A non-transitory computer readable medium having stored thereon executable instructions that when executed by the processor of a computer of a test device control the computer to perform steps comprising:
operating as a timing synchronization protocol master for communicating with a device under test operating as a timing synchronization protocol slave or a timing synchronization protocol boundary clock to synchronize a clock of the device under test with a clock of the test device;
sending a synchronization message to the device under test, causing the device under test to synchronize the clock of the device under test with the clock of the test device;
receiving, from the device under test, a reverse synchronization message including clock information and a sent timestamp for the reverse synchronization message, generating a received timestamp for the reverse synchronization message using the clock of the test device; and
using the clock information to quantify a synchronization error between the clock of the device under test and the clock of the test device, including determining the synchronization error for the clock of the device under test based on the sent timestamp, the received timestamp, and a path delay between the test device and the device under test over a data communications network.

\* \* \* \* \*